US012698203B2

(12) United States Patent
Berthelot et al.

(10) Patent No.: US 12,698,203 B2
(45) Date of Patent: Aug. 4, 2026

(54) MEMS DEVICE MANUFACTURING METHOD

(71) Applicant: Commissariat à l'Énergie Atomique et aux Énergies Alternatives, Paris (FR)

(72) Inventors: Audrey Berthelot, Grenoble Cedex (FR); Philippe Robert, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 643 days.

(21) Appl. No.: 18/139,973

(22) Filed: Apr. 27, 2023

(65) Prior Publication Data

US 2023/0348262 A1 Nov. 2, 2023

(30) Foreign Application Priority Data

Apr. 29, 2022 (FR) ...................................... 2204075

(51) Int. Cl.
B81C 1/00 (2006.01)
(52) U.S. Cl.
CPC .. B81C 1/00801 (2013.01); *B81C 2201/0132* (2013.01); *B81C 2201/056* (2013.01)
(58) Field of Classification Search
CPC ............ B81C 1/00182; B81C 1/00357; B81C 1/00801; B81C 2201/0132;
(Continued)

(56) References Cited

U.S. PATENT DOCUMENTS

2008/0136000 A1* 6/2008 Fischer ..................... B81B 7/02
257/E23.128
2013/0137245 A1* 5/2013 Robert ................ B81C 1/00626
438/478
(Continued)

FOREIGN PATENT DOCUMENTS

EP 2 599 745 A1 6/2013
EP 2 952 472 A2 12/2015

OTHER PUBLICATIONS

Preliminary Search Report for French Application No. 2204075, dated Nov. 25, 2022.
(Continued)

*Primary Examiner* — Chad M Dicke
*Assistant Examiner* — Priya M Rampersaud
(74) *Attorney, Agent, or Firm* — Wolf, Greenfield & Sacks, P.C.

(57) ABSTRACT

The present description concerns a method of manufacturing a microelectromechanical device, including the following successive steps: providing an SOI structure comprising a first semiconductor layer on an insulating layer; forming a second semiconductor layer by epitaxy on top of and in contact with the upper surface of the first semiconductor layer; transferring and bonding, by molecular bonding, a third semiconductor layer onto and in contact with the upper surface of the second semiconductor layer; and forming trenches vertically extending from the upper surface of the third semiconductor layer all the way to the upper surface of the insulating layer, said trenches laterally delimiting a mechanical element of the device.

11 Claims, 3 Drawing Sheets

(58) Field of Classification Search
CPC ........ B81C 2201/019; B81C 2201/056; B81C
1/00134; B81C 1/00603; B81C 2201/014;
B81C 1/00626; B81C 1/00261; B81C
1/00269; B81C 1/00301; B81C 1/00349;
B81C 1/00476; B81C 2201/0115; B81C
1/00039; B81C 1/00158; B81C 1/00246;
B81C 1/00277; B81C 1/00984; B81C
2201/0116; B81C 2201/0136; B81C
2201/0171; B81C 2201/0176; B81C
2203/0136; B81C 2203/031; B81C
2203/035; B81C 2203/036; B81C
2203/037; B81C 2203/038; B81C
2203/0735; B81B 2203/0109; B81B
2201/0264; B81B 2203/0136; B81B
2203/0127; B81B 2203/0315; B81B
2203/051; B81B 2207/015; B81B
2207/07; B81B 2201/0235; B81B
2201/0242; B81B 2201/025; B81B
2201/0257; B81B 2201/0271; B81B
2201/033; B81B 2203/0118; B81B
2203/0163; B81B 2203/0307; B81B
2203/033; B81B 2203/04; B81B
2207/012; B81B 3/0051; B81B 3/0059;
B81B 3/007; B81B 3/0078; B81B 5/00;
B81B 7/0025; B81B 7/0035; B81B
7/0058; B81B 7/007; B81B 7/02
See application file for complete search history.

(56) References Cited

U.S. PATENT DOCUMENTS

2014/0054730 A1*  2/2014  Graham ............. B81C 1/00015
                                                    257/415
2021/0229985 A1*  7/2021  Suzuki ................. B81B 7/0041

OTHER PUBLICATIONS

Robert et al., M&Nems: A new approach for ultra-low cost 3D inertial sensor. 2009 IEEE Sensors. Oct. 25, 2009:963-6.

* cited by examiner

MEMS DEVICE MANUFACTURING METHOD

CROSS REFERENCE TO RELATED APPLICATIONS

This application claims priority to French application number 2204075, filed Apr. 29, 2022. The contents of this application are incorporated by reference in their entirety.

TECHNICAL BACKGROUND

The present disclosure generally concerns electromechanical devices and particularly devices based on microelectromechanical systems or MEMSs. It particularly applies to devices based on micro- and nanoelectromechanical systems or M&NEMSs.

PRIOR ART

A MEMS device typically comprises at least one mechanical element, for example, a seismic mass, having micrometer-range dimensions. This element may take various forms according to the desired function of the device. MEMS devices may for example be used to implement measurement functions of various natures, for example, displacement or pressure measurements. MEMS devices are for example used in sensors of accelerometer, gyrometer type, pressure sensors, etc.

It would be desirable to at least partly improve certain disadvantages of known MEMS devices and of their manufacturing methods.

SUMMARY OF THE INVENTION

For this purpose, an embodiment provides a method of manufacturing a microelectromechanical device comprising the following successive steps:

providing an SOI structure comprising a first semiconductor layer on an insulating layer;

forming a second semiconductor layer by epitaxy on top of and in contact with the upper surface of the first semiconductor layer;

transferring and bonding, by molecular bonding, a third semiconductor layer onto and in contact with the upper surface of the second semiconductor layer; and forming trenches extending vertically from the upper surface of the third semiconductor layer to the upper surface of the insulating layer, said trenches laterally delimiting a mechanical element of the device.

According to an embodiment, the first, second, and third semiconductor layers are made of silicon.

According to an embodiment, the step of forming of the trenches is followed by a disengagement step, where the insulating layer is removed under the mechanical element.

According to an embodiment, the step of transfer of the third semiconductor layer onto the second semiconductor layer is preceded by a step of cleaning by plasma treatment of the lower surface of the third semiconductor layer and/or of the upper surface of the second semiconductor layer.

According to an embodiment, the mechanical element has a thickness in the range from 10 μm to 300 μm, for example from 20 μm to 100 μm, for example, from 30 μm to 80 μm, for example, from 40 μm to 60 μm.

According to an embodiment, the method further comprises, before the step of forming of the second semiconductor layer, a step of local etching of the first semiconductor layer to define in said first semiconductor layer electromechanical transduction elements of micrometer- or sub-micrometer-range dimensions.

According to an embodiment, the method comprises, after said local etching step and before the step of forming of the second semiconductor layer, a step of forming of protection elements made of an insulating material located in front of said electromechanical transduction elements of micrometer- or sub-micrometer-range dimensions.

According to an embodiment, the protection elements are removed with the insulating layer during the disengagement step.

Another embodiment provides a microelectromechanical device comprising a mechanical element comprising, across its thickness, a first semiconductor layer, a second semiconductor layer formed by epitaxy on top of and in contact with the upper surface of the first semiconductor layer, and a third semiconductor layer bonded, by molecular bonding, on top of and in contact with the upper surface of the second semiconductor layer.

According to an embodiment, the mechanical element has a thickness in the range from 10 μm to 300 μm, for example from 20 μm to 100 μm, for example, from 30 μm to 80 μm, for example, from 40 μm to 60 μm.

According to an embodiment, the device further comprises electromechanical transduction elements of micrometer- or sub-micrometer-range dimensions formed in the first semiconductor layer.

BRIEF DESCRIPTION OF THE DRAWINGS

The foregoing and other features and advantages will be discussed in detail in the following non-limiting description of specific embodiments in connection with the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, only some of the steps of the MEMS device manufacturing method and only certain elements of the MEMS devices have been detailed, the other steps and elements being usual steps and elements or being within the abilities of those skilled in the art based on the indications of the present disclosure.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made, unless specified otherwise, to the orientation of the figures.

Unless specified otherwise, the expressions "around", "approximately", "substantially" and "in the order of" signify within 10%, and preferably within 5%.

FIGS. 1 to 8 partially and schematically illustrate steps of an example of a method of manufacturing a MEMS device according to an embodiment. More particularly, in this example, the formed device is an M&NEMS device, comprising electromechanical transduction elements of micrometer- or sub-micrometer-range dimensions, for example, of nanometer-range dimensions, or NEMS elements, for example, strain gauges or actuators, coupled to mechanical elements of micrometer-range dimensions or MEMS elements, for example, a seismic mass. In FIGS. 1 to 8, the forming of a single MEMS device has been (partially) shown. In practice, a plurality of MEMS devices, for example, identical or similar, may be simultaneously formed from a same initial substrate, and then singulated during a cutting step, not detailed.

Figure 1:
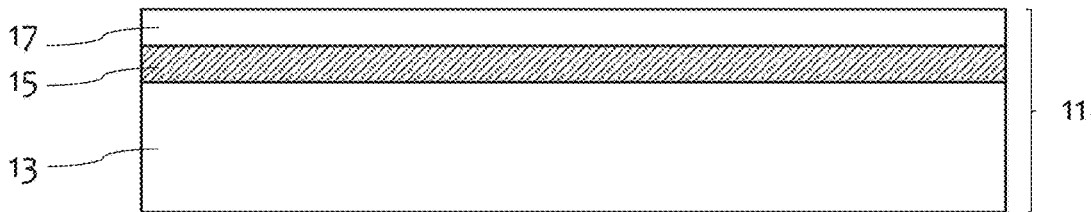
FIG. 1, FIG. 2, FIG. 3, FIG. 4, FIG. 5, FIG. 6, FIG. 7, and FIG. 8 are cross-section views partially and schematically illustrating successive steps of an example of a method of manufacturing a MEMS device according to an embodiment.

FIG. 1 shows an initial structure 11 of SOI ("Semiconductor On Insulator") type. Structure 11 comprises, for example, a support 13 made of a semiconductor material, topped with an electrically-insulating layer 15, itself topped with a semiconductor layer 17.

As an example, support 13 is made of silicon. Support 13 has, for example, a thickness in the range from 200 µm to 800 µm, for example, from 500 µm to 750 µm.

As an example, insulating layer 15 is made of an oxide, for example, of silicon oxide ($SiO_2$). Insulating layer 15 for example has a thickness in the range from 0.1 µm to 4 µm, for example, from 0.3 µm to 3 µm, for example, in the order of 2 µm.

As an example, semiconductor layer 17 is made of silicon, for example, of single-crystal silicon. Semiconductor layer 17 for example has a thickness in the range from 50 nm to 50 µm, for example, from 200 nm to 2 µm, for example equal to approximately 250 nm or approximately 500 nm. As an example, semiconductor layer 17 is doped.

As an example, insulating layer 15 is formed on top of and in contact with support 13 so that the lower surface of insulating layer 15 is in contact with the upper surface of support 13. Semiconductor layer 17 is for example formed on top of and in contact with insulating layer 15 so that the lower surface of semiconductor layer 17 is in contact with the upper surface of insulating layer 15.

Figure 2:
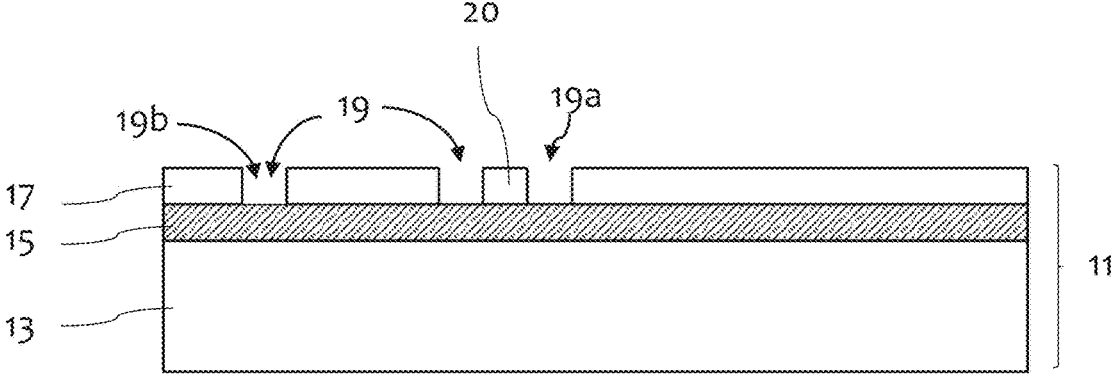

FIG. 2 illustrates the structure obtained at the end of a step of local etching of semiconductor layer 17 to form, therein, openings 19. Openings 19 for example thoroughly cross semiconductor layer 17, that is, they cross layer 17 across its entire thickness, to expose the upper surface of insulating layer 15.

Openings 19 particularly comprise trenches 19a laterally delimiting one or a plurality of electromechanical transduction elements of micrometer- or sub-micrometer-range dimensions (NEMS) 20 of the device. Elements 20 are for example strain gauges, for example resonant beams or piezoresistive gauges, each comprising one or a plurality of silicon bars of nanometer-range dimensions defined in the silicon layer 17 of the SOI structure.

Openings 19 may further comprise at least one opening 19b intended to allow the subsequent taking of an electric contact on the underlying semiconductor support 13.

Openings 19a and 19b are for example simultaneously formed during a same photolithography and etch step.

Figure 3:
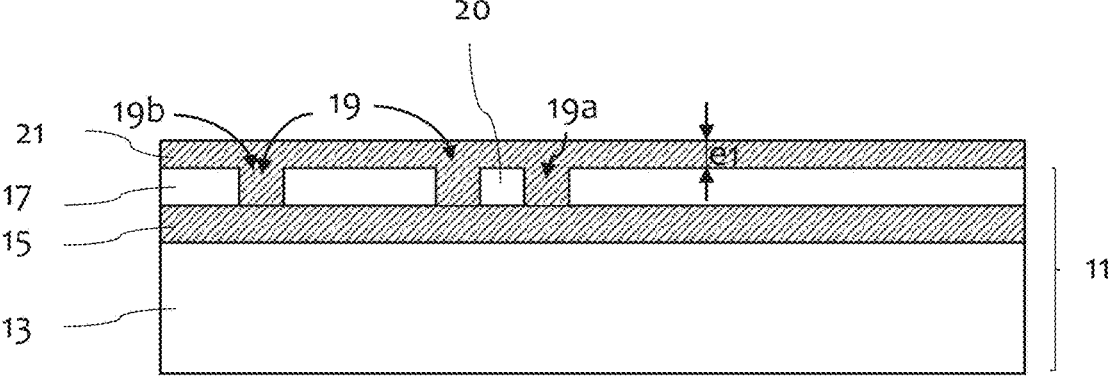

FIG. 3 illustrates the structure obtained at the end of a step of deposition of an electrically-insulating layer 21 on the upper surface of the structure of FIG. 2. Insulating layer 21 for example extends continuously over the entire upper surface of the structure, that is, in this example, over the upper surface of semiconductor layer 17 and in openings 19. As an example, insulating layer 21 extends on top of an in contact with the upper surface of semiconductor layer 17 outside of openings 19, and on top of and in contact with the upper surface of insulating layer 15 and with the sides of semiconductor layer 17 in openings 19.

Layer 21 is for example made of silicon oxide. Layer 21 for example has a thickness e1, measured above the surface of conductive layer 17, in the range from 50 nm to 2 µm, for example in the range from 0.1 µm to 0.5 µm, for example in the order of 0.3 µm. As an example, layer 21 entirely fills openings 19. Layer 21 for example has a substantially planar upper surface continuously extending over the entire upper surface of the structure.

Figure 4:
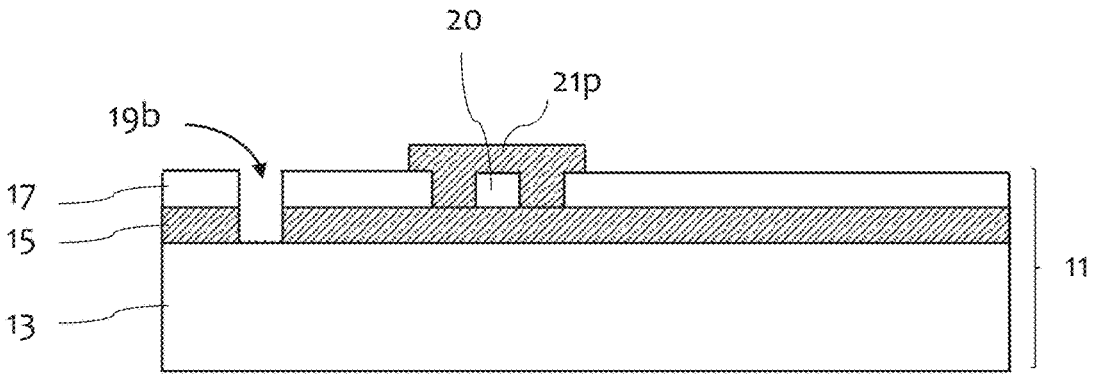

FIG. 4 illustrates the structure obtained at the end of a step of local removal of insulating layer 21, for example, by photolithography and etching. As an example, layer 21 is removed from substantially the entire upper surface of the structure illustrated in FIG. 3 except in front of NEMS elements 20 and of the trenches 19a laterally delimiting these elements. Thus, at the end of this step, there only remain portions 21p of layer 21, covering the upper surface and the sides of NEMS elements 20 to protect NEMS elements 20. During this step, layer 21 is removed from contact opening(s) 19b. Further, during this step, the etching continues through the insulating layer 15 of the SOI structure in front of opening 19b, to expose the upper surface of substrate 13 and thus allow the taking of an electric contact called ground contact on substrate 13.

Figure 5:
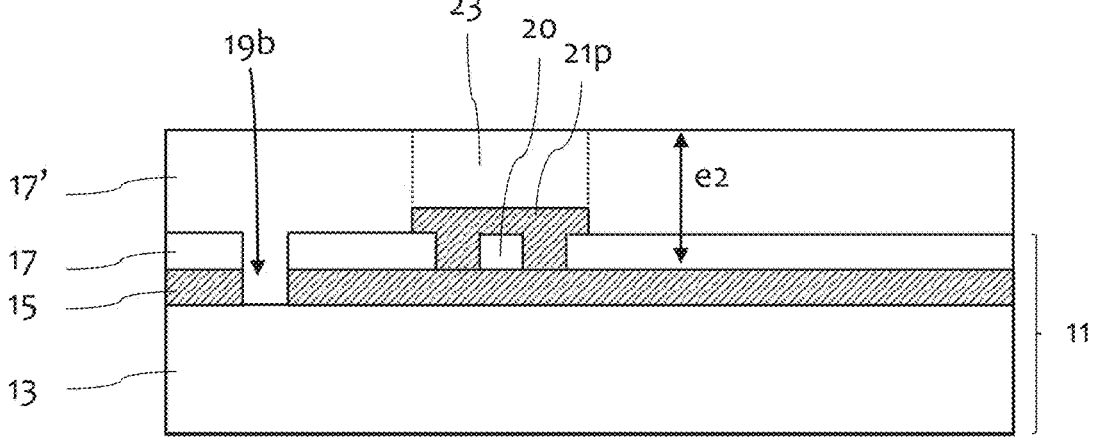

FIG. 5 illustrates the structure obtained at the end of a step of epitaxial deposition of a semiconductor layer 17', for example, made of the same material as layer 17, on the upper surface of the structure of FIG. 4. In this example, layer 17' continuously extends over the entire surface of the structure and particularly fills openings 19b. Thus, in front of openings 19b, layer 17' comes into contact, by its lower surface, with the upper surface of substrate 13.

Layer 17' is formed by epitaxial growth from the upper surface of semiconductor layer 17. Thus, layer 17' is for example monocrystalline over substantially the entire surface of the structure, except in front of the insulating protection regions 21p covering the NEMS elements 20 of the device, where layer 17' may have a polycrystalline structure. In the example of FIG. 5, the polycrystalline portion of layer 17' located on top of and in contact with the insulating protection regions 21p of the NEMS elements is designated with reference 23.

As an example, layer 17' is doped in-situ, for example, with boron, during its deposition.

At the end of the deposition step, the upper surface of layer 17' may be non-planar. Indeed, the growth does not necessarily have the same speed in front of openings 19b, in front of insulating protection layers 21p, and in front of the portions of the upper surface of layer 17 non-coated with insulating regions 21p. Preferably, a step of planarization of the upper surface of layer 17' is implemented at the end of the deposition step.

As an example, at the end of the planarization step, layers 17 and 17' have, outside of openings 19b and of the regions of forming of the NEMS elements 20 of the device, a cumulated thickness e2, from the upper surface of buried insulating layer 15, in the range from 1 μm to 50 μm, for example in the range from 5 μm to 30 μm, for example in the range from 10 μm to 20 μm.

As an example, the planarization step is carried out by CMP ("Chemical Mechanical Polishing"). As a variant, the planarization step is performed by a polishing or mechanical grinding followed by a dry polish. Still as a variant, the planarization step is carried out by a combination of the above-described techniques.

Figure 6:
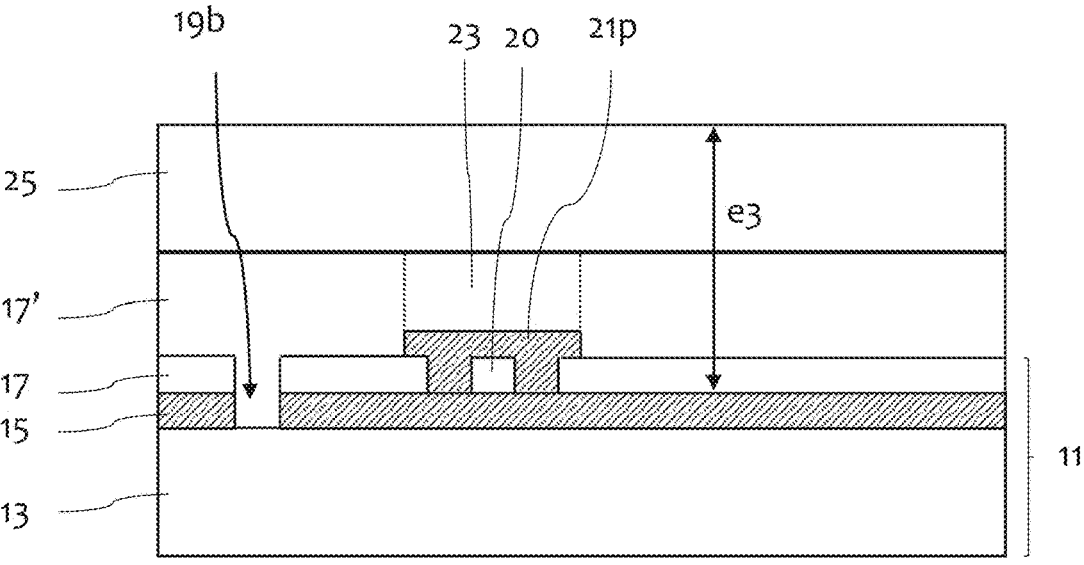

FIG. 6 illustrates the structure obtained at the end of a step of transfer of a semiconductor layer 25 onto the upper surface of the structure illustrated in FIG. 5 and more particularly onto the upper surface of layer 17'. As an example, layer 25 is transferred onto and in contact with the upper surface of layer 17'. As an example, semiconductor layer 25 is a semiconductor wafer or a portion of a semiconductor wafer. Layer 25 is for example made of the same material as layer 17', for example, of silicon. Layer 25 is preferably monocrystalline. Layer 25 is for example doped. As an example, layer 25 corresponds to the upper semiconductor crystal layer of an SOI structure. In this case, the transfer substrate of the SOI structure may be used as a handle during the transfer. After the transfer and the bonding of layer 25 onto the upper surface of layer 17', the support substrate and the buried insulating layer of the SOI structure may be removed to only keep layer 25. As a variant, layer 25 corresponds to a portion of the thickness of a solid semiconductor substrate. The substrate is first transferred and bonded onto the upper surface of layer 17', then thinned, for example, by grinding and/or CMP, to only keep layer 25.

Layer is for example bonded by molecular bonding of its lower surface to the upper surface of layer 17'. The bonding is for example a molecular bonding of SAB ("Surface Activated Bonding") type, that is, the transfer step is preceded by a step of preparation or cleaning of the bonding surface of layer 25 and/or of the bonding surface of layer 17', by plasma treatment.

To improve the bonding, after the transfer of layer 25 onto and in contact with the upper surface of layer 17', an anneal may be provided, for example, at a temperature in the order of 400° C.

Outside of openings 19b and of the regions of forming of the NEMS elements 20 of the device, layers 17, 17', and 25 have a cumulated thickness e3. Thickness e3 is for example determined according to the type of MEMS elements which are desired to be formed. Thickness e3 for example corresponds to the final thickness of a mechanical element, for example, a seismic mass, of a MEMS element of the device. Thickness e3 may be adjusted according to the considered type of application. Thickness e3 is for example in the range from 10 μm to 300 μm, for example from 20 μm to 100 μm, for example from 30 μm to 80 μm, for example, from 40 to 60 μm.

Figure 7:
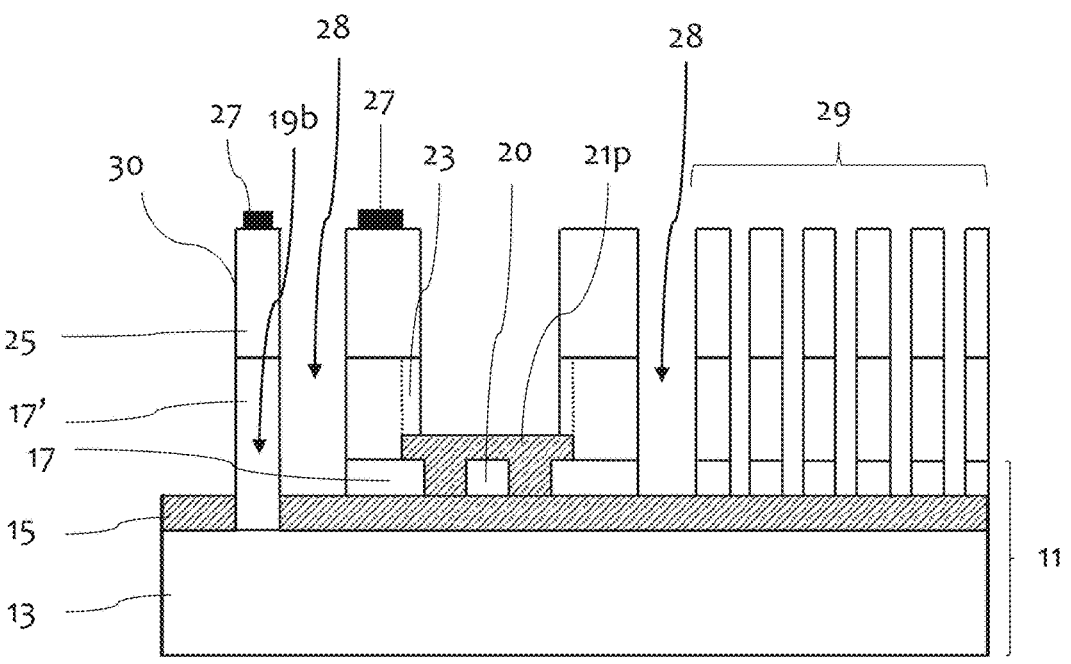

FIG. 7 illustrates the structure obtained at the end of a step of local etching, from the upper surface of layer 25, of the stack formed by layers 17, 17', and 25.

As an example, the etch step is carried out through a mask, for example, a hard mask, made of an oxide, for example of tetraethyl orthosilicate (TEOS). The etching of layers 25, 17', and 17 is for example a deep reactive ion etching (DRIE).

During this step, openings and/or vertical trenches 28 are formed in the stack of layers 25, 17', and 17. As an example, these trenches and/or openings emerge onto the upper surface of layer 15 or onto the upper surface of protections 21p. The etching is for example an etching of the semiconductor material(s) of layers 17, 17', and 25 selective over the dielectric material of layer 15 and of protection elements 21. Trenches and openings 28 define and laterally delimit, in the stack of semiconductor layers 17, 17', and 25, MEMS elements particularly comprising a mechanical element 29, for example, a seismic mass. In this example, trenches and openings 28 further enable to expose the upper surface of protection elements 21p in front of the NEMS elements 20 of device. Further, in this example, trenches and openings 28 further define, in front of the ground contact opening 19b, a portion 30 of the stack of layers 17' and 17, also called ground contact region, in contact, by its lower surface, with substrate 13.

As an example, the above-described etch step is preceded by a step of forming of pads 27, for example, on top of and in contact with the upper surface of semiconductor layer 25, in front of portions of layer 25 not removed during the subsequent etch step and outside of the MEMS elements and particularly of the mechanical element 29 of the device. As an example, pads 27 are made of germanium and have, for example, a thickness in the range from 100 nm to 1 μm, for example, in the order of 500 nm. Pads 27 for example allow the subsequence sealing of the structure obtained at the end of the method described in relation with FIGS. 1 to 8 with a cover (not shown).

Figure 8:
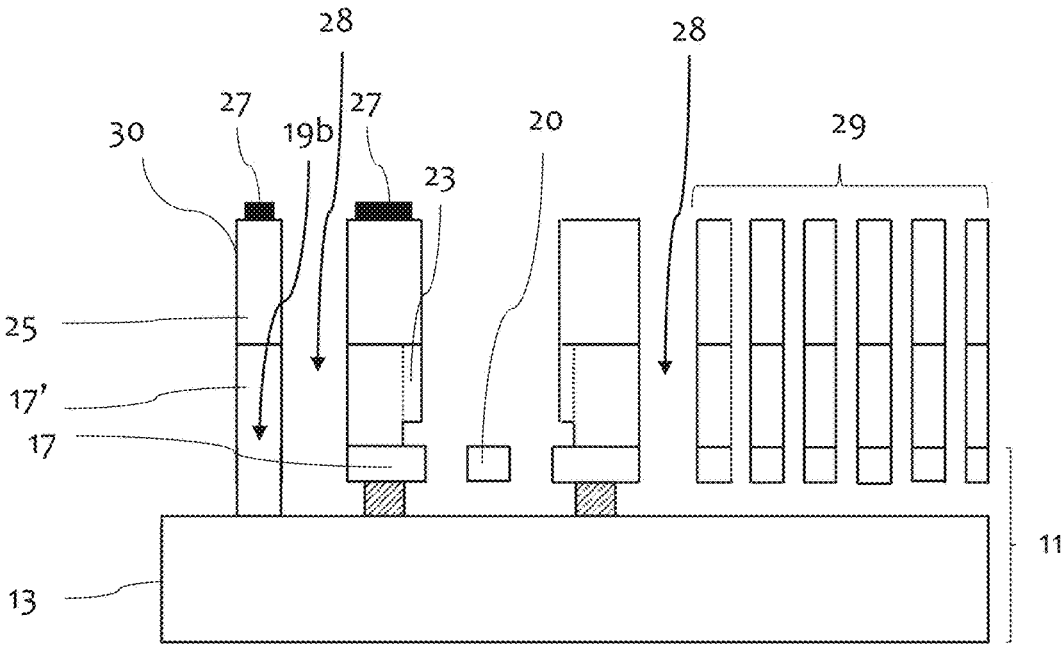

FIG. 8 illustrates the structure obtained at the end of a step of removal of a portion of layer 15 and of the insulating protection regions 21p. During this step, also called disengagement step, layer 15 and protection elements 21p are selectively etched over semiconductor layers 17, 17', and 25, to disengage the MEMS and NEMS elements of the device. As an example, the etching is a chemical vapor etching. As an example, the etching is performed under a hydrogen fluoride step (HF). As an example, the disengagement has a speed in the range from 5 nm/min to 100 nm/min, for example in the range from 20 nm/min to 60 nm/min, for example, in the order of 48 nm/min. The etching time may be controlled to keep portions of dielectric layer 15 used as an anchor or mechanical support for the MEMS and NEMS elements of the device.

As an example, polysilicon portions may remain in the structure obtained at the end of this step. Indeed, as an example, close to NEMS elements 20, a portion of regions 23 may remain.

An advantage of the above-described method and particularly of the step of FIG. 6 of transfer of a semiconductor layer 25 onto and in contact with the upper surface of epitaxial semiconductor layer 17', is that it enables to increase the thickness of the mechanical element with respect to a method which does not comprise this step and where the thickness of the mechanical element would only be defined by the thickness of layers 17 and 17'. This enables to improve the performance of the MEMS devices and to address applications requiring relatively thick mechanical elements, for example, seismic masses.

Various embodiments and variants have been described. Those skilled in the art will understand that certain features of these various embodiments and variants may be combined, and other variants will occur to those skilled in the art. In particular, the described embodiments are not limited to the examples of materials and of dimensions mentioned in the present disclosure.

Finally, the practical implementation of the described embodiments and variations is within the abilities of those skilled in the art based on the functional indications given hereabove.

7
8

The invention claimed is:

1. Method of manufacturing a microelectromechanical device comprising the following successive steps:

providing an SOI structure comprising a first semiconductor layer on an insulating layer;

forming a second semiconductor layer by epitaxy on top of and in contact with the upper surface of the first semiconductor layer;

transferring and bonding, by molecular bonding, a third semiconductor layer onto and in contact with the upper surface of the second semiconductor layer; and forming trenches vertically extending from the upper surface of the third semiconductor layer to the upper surface of the insulating layer, said trenches laterally delimiting a mechanical element of the device.

2. Method according to claim 1, wherein the first, second, and third semiconductor layers are made of silicon.

3. Method according to claim 1, wherein the step of forming of the trenches is followed by a disengagement step, where the insulating layer is removed under the mechanical element.

4. Method according to claim 1, wherein the step of transfer of the third semiconductor layer onto the second semiconductor layer is preceded by a step of cleaning by plasma treatment of the lower surface of the third semiconductor layer and/or of the upper surface of the second semiconductor layer.

5. Method according to claim 1, wherein the mechanical element has a thickness in the range from 10 μm to 300 μm, for example, from 20 μm to 100 μm, for example, from 30 μm to 80 μm, for example, from 40 μm to 60 μm.

6. Method according to claim 1, further comprising, before the step of forming of the second semiconductor layer, a step of local etching of the first semiconductor layer to define in said first semiconductor layer electromechanical transduction elements of micrometer- or sub-micrometer-range dimensions.

7. Method according to claim 6, further comprising, after said local etching step and before the step of forming of the second semiconductor layer, a step of forming of protection elements made of an insulating material located in front of said electromechanical transduction elements of micrometer- or sub-micrometer-range dimensions.

8. Method according to claim 7, wherein the protection elements are removed with the insulating layer during the disengagement step.

9. Microelectromechanical device comprising a mechanical element comprising, across its thickness, a first semiconductor layer of an SOI structure comprising the first semiconductor layer on an insulating layer, a second semiconductor layer formed by epitaxy on top of and in contact with the upper surface of the first semiconductor layer, and a third semiconductor layer bonded, by molecular bonding, on top of and in contact with the upper surface of the second semiconductor layer, the mechanical element being laterally delimited by trenches vertically extending from the upper surface of the third semiconductor layer to the upper surface of the insulating layer.

10. Device according to claim 9, wherein the mechanical element has a thickness in the range from 10 μm to 300 μm, for example from 20 μm to 100 μm, for example from 30 μm to 80 μm, for example, from 40 μm to 60 μm.

11. Device according to claim 9, further comprising electromechanical transduction elements of micrometer- or sub-micrometer-range dimensions formed in the first semiconductor layer.

* * * * *